United States Patent [19]

Durante et al.

[11] Patent Number: 5,559,988
[45] Date of Patent: Sep. 24, 1996

[54] METHOD AND CIRCUITRY FOR QUEUING SNOOPING, PRIORITIZING AND SUSPENDING COMMANDS

[75] Inventors: Richard J. Durante, Citrus Heights; Rodney R. Rozman; Mickey L. Fandrich, both of Placerville, all of Calif.

[73] Assignee: Intel Corporation, Santa Clara, Calif.

[21] Appl. No.: 408,100

[22] Filed: Mar. 21, 1995

Related U.S. Application Data

[63] Continuation of Ser. No. 175,734, Dec. 30, 1993, abandoned.

[51] Int. Cl.$^6$ ............................................. G06F 12/06
[52] U.S. Cl. ................ 395/479; 395/427; 395/430; 395/473; 364/249.2; 364/254.3
[58] Field of Search ............................................. 395/375

[56] References Cited

U.S. PATENT DOCUMENTS

| | | |
|---|---|---|
| 4,805,098 | 2/1989 | Mills, Jr. et al. . |
| 4,956,820 | 9/1990 | Hashimoto . |
| 5,179,679 | 1/1993 | Shoemaker . |
| 5,265,229 | 11/1993 | Sareen . |
| 5,287,469 | 2/1994 | Tsuboi . |
| 5,293,347 | 3/1994 | Ogawa . |
| 5,307,470 | 4/1994 | Kataoka et al. . |
| 5,341,330 | 8/1994 | Wells et al. ............................ 365/185 |
| 5,353,256 | 10/1994 | Fandrich et al. ..................... 365/230.03 |
| 5,355,464 | 10/1994 | Fandrich et al. ........................... 395/425 |
| 5,369,616 | 11/1994 | Wells et al. ............................ 365/218 |
| 5,369,754 | 11/1994 | Fandrich et al. ........................... 395/425 |
| 5,377,145 | 12/1994 | Kynett et al. ......................... 365/189.05 |
| 5,388,083 | 2/1995 | Assar et al. ............................ 365/218 |
| 5,412,793 | 3/1995 | Kreifels et al. ........................... 395/425 |
| 5,448,712 | 9/1995 | Kynett et al. ............................ 395/430 |

*Primary Examiner*—Krisna Lim
*Assistant Examiner*—Saleh Najjar
*Attorney, Agent, or Firm*—Blakely, Sokoloff, Taylor & Zafman

[57] ABSTRACT

A method of, and apparatus for, storing and prioritizing among erase block and program word commands is described for a nonvolatile memory device. This prevents the depth of an operation queue responsible for queuing program and erase commands from limiting the number of erase commands that are stored at one time. The first erase command received serves as a place holder, holding a place within the operation queue for all subsequently received erase commands. All subsequently received erase commands are absorbed and cleared from the operation queue. As a result, the operation queue may receive additional commands and an erase command may be queued for every block of memory within the nonvolatile memory device. Absorbed erase commands can be prioritized in response to subsequently received program commands. Blocks are flagged for priority erasure using a priority register. Additionally, interrupt windows located at safe points permit interruption of erase operations to handle command interrupts. The erasure of one or more blocks can be suspended so that a program word command can be serviced thereby permitting program word commands to jump ahead of erase block commands in the queue. Furthermore, a query can be made to determine the status of any block and the block status query will consider pending commands in the operation queue when determining the block status for the block queried.

28 Claims, 6 Drawing Sheets

METHOD AND CIRCUITRY FOR QUEUING SNOOPING, PRIORITIZING AND SUSPENDING COMMANDS

This is a continuation of application Ser. No. 08/175,734, filed Dec. 30, 1993, now abandoned.

FIELD OF THE INVENTION

The present invention relates to nonvolatile semiconductor memories. In particular, the present invention relates to a method and circuitry for storing program and erase commands in a command queue of a nonvolatile semiconductor memory.

BACKGROUND OF THE INVENTION

One prior nonvolatile semiconductor memory is the flash electrically erasable programmable read-only memory ("flash"). Flash memories are programmed electrically and, once programmed, retain their data until erased. After erasure, flash memories can be programmed with new code or data.

Flash memories differ from conventional electrically erasable programmable read-only memories ("EEPROM") with respect to erasure. Conventional EEPROMs typically use a select transistor for individual byte erasure control. Flash memories, on the other hand, typically achieve much higher densities using single transistor cells. Some prior flash memories are erased by applying a high voltage to the sources of every memory cell in the memory array simultaneously. This results in the full array erasure.

Flash memory conventions define a logical one as a state where few, if any, electrons are stored on the floating gate of a memory cell. Convention also defines a logical zero as the state where many electrons are stored on the floating gate of the memory cell. Erasure of the flash memory causes a logical one to be stored in each bit cell. Flash memory cells cannot be overwritten individually from a logical zero to a logical one without prior erasure. A flash memory cell can be overwritten individually from a logical one to a logical zero, however, because this entails simply adding the intrinsic number of electrons associated with the erased state to a floating gate.

The process for erasure, programming and verification of flash memories requires careful control of the voltages used to perform those steps. For example, one prior art flash memory is the 28F008 complimentary metal oxide semiconductor ("CMOS") flash memory sold by Intel Corporation of Santa Clara, Calif., which is an 8 megabit flash memory. The flash memory includes a command register to manage electrical erasure and reprogramming. Commands for programming and erasure are written to the command register from a controlling microprocessor using standard microprocessor write timings. The command register contents serve as input to an internal state machine that controls erasure and programming circuitry.

Typically, only one operation can be performed at a time within a flash memory. This means that a high priority command must await completion of a low priority command that was issued before the high priority command. For example, erase commands are time consuming and fairly low priority. In contrast, program commands can be executed fairly quickly and are of a higher priority than erase commands. Nonetheless, in prior flash memories, once execution of an erase command has begun the execution of a program command is delayed because it cannot be accepted until after complete execution of the erase command.

SUMMARY OF THE INVENTION

An object of the present invention is to provide a method and circuitry which allows a user to treat block of memory within a nonvolatile memory device as a separate memory device.

Another object of the present invention is to permit a user of a nonvolatile memory device having many blocks of memory to issue block erase commands without regard to whether other blocks of memory are currently being programmed or erased.

A still further object of the present invention is permit to a user of a nonvolatile memory device having many blocks of memory to issue as many erase block commands as there are blocks of memory.

Yet another object of the present invention is to allow erase block commands to be interrupted to handle subsequently received program word commands.

A still further object of the present invention is prioritization of erase block commands in response to program word command interrupts.

A method of, and apparatus for, storing and prioritizing among erase block and program word commands is described for a nonvolatile memory device. This prevents the depth of an operation queue responsible for queuing program and erase commands from limiting the number of erase commands that are stored at one time. The first erase command received serves as a place holder, holding a place within the operation queue for all subsequently received erase commands. All subsequently received erase commands are absorbed and cleared from the operation queue. As a result, the operation queue may receive additional commands and an erase command may be queued for every block of memory within the nonvolatile memory device. Absorbed erase commands can be prioritized in response to subsequently received program commands. Blocks are flagged for priority erasure using a priority register. Additionally, interrupt windows located at safe points permit interruption of erase operations to handle command interrupts. The erasure of one or more blocks can be suspended so that a program word command can be serviced thereby permitting program word commands to jump ahead of erase block commands in the queue. Furthermore, a query can be made to determine the status of any block and the block status query will consider pending commands in the operation queue when determining the block status for the block queried.

Other objects, features, and advantages of the present invention will be apparent from the accompanying drawings and the detailed description that follows.

BRIEF DESCRIPTION OF THE FIGURES

The present invention is illustrated by way of example and not limitation in the figures of the accompanying drawings in which references indicate similar elements and in which.

DETAILED DESCRIPTION

Figure 1:
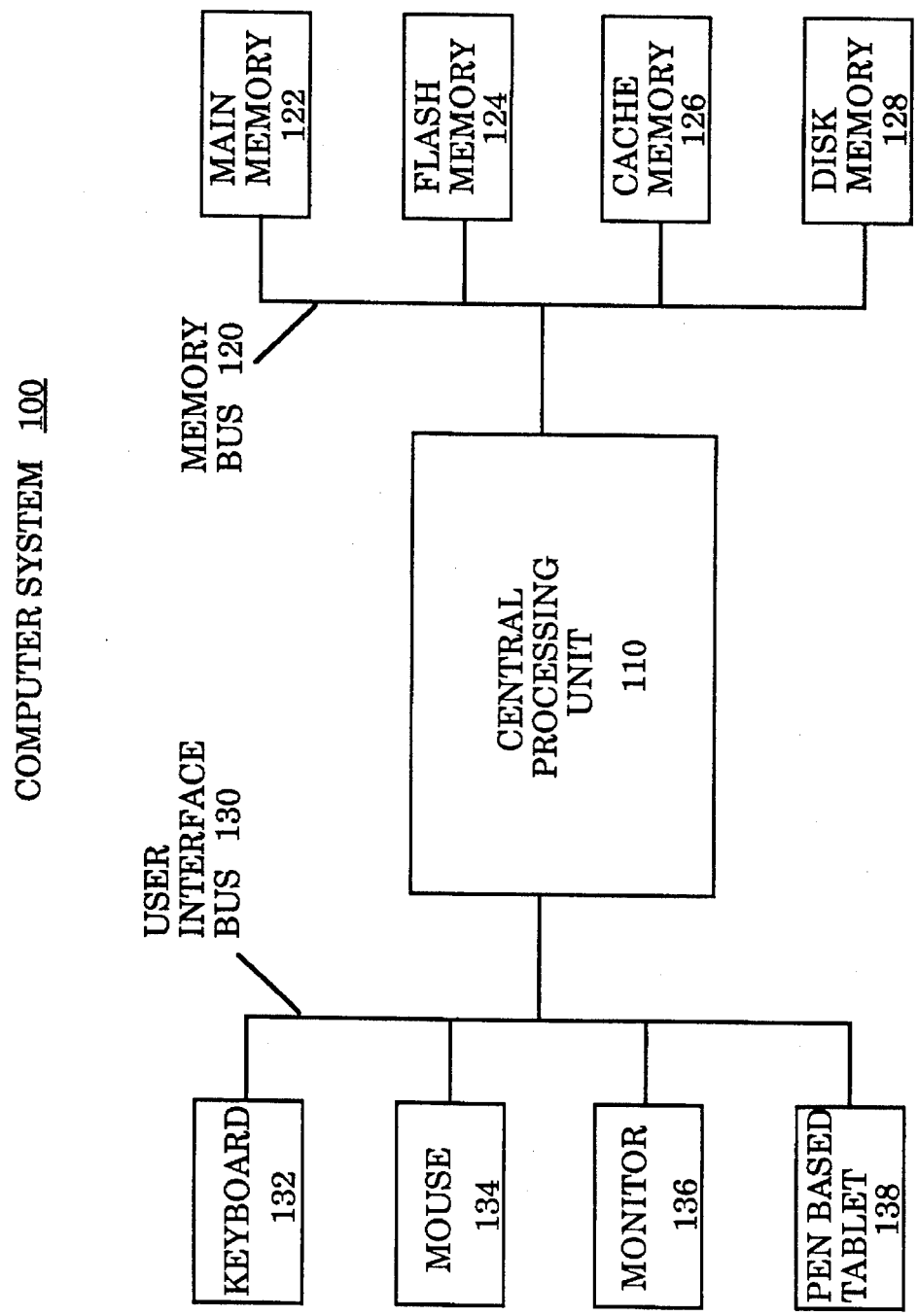
FIG. 1 illustrates a computer system that includes a nonvolatile memory device that can queue program word and erase block commands.

FIG. 1 illustrates a computer system that includes a flash memory device that has a program word and erase block command queue. In computer system 100, central processing unit 110 is shown coupled to various input/output devices over user interface bus 130. Furthermore, central processing unit 110 is coupled to various memory devices over memory bus 120. Although user interface bus 130 and memory bus 120 are shown in FIG. 1 as being separate buses, in an alternate environment, the two buses are combined into a single system bus. Furthermore, although computer system 100 is shown in FIG. 1 as having several user interface and memory devices, these devices are exemplary devices. In alternate embodiments more, or fewer, user interface and memory devices can be employed.

Typically, a user of computer system 100 will enter commands to central processing unit 110 by keyboard 132, mouse 134 or pen based tablet 138, or by a combination thereof. In response, central processing unit 110 will execute the commands and provide a display on monitor 136. In this way, the user can interface with central processing unit 110.

When central processing unit 110 executes a user command, it will typically need to retrieve data and instructions from memory devices over memory bus 120. Main memory 122 is typically fast access volatile memory such as static random access memory (SRAM). Disk memory 128, on the other hand, is nonvolatile memory such as a hard disk or floppy disk. In contrast to main memory 122, disk memory 128 typically has a much slower access time but a much greater storage capacity. Cache memory 126 is typically volatile memory that has both a memory capacity and an access time generally in between that of main memory 122 and disk memory 128. During the execution of a program, central processing unit 110 will work directly from information stored in main memory 122 because of the quick access speed of main memory 122. Because main memory 122 is volatile memory and has a small memory capacity, the required information is usually stored in disk memory 128 and copied into main memory 122 as required. Frequently used information from disk memory 128 that cannot be stored in main memory 122 is loaded into volatile cache memory 126. Once loaded into cache memory 126, the frequently needed information can be retrieved faster than it could be retrieved from disk memory 128.

Flash memory 124 combines the nonvolatility of disk memory 128 with the speed of access of main memory 122. Although flash memory 124 can be read from quickly, writing to flash memory 124 through a program word command is a relatively slow operation. Furthermore, flash memory 124 has been divided into blocks of memory that must be erased individually. If a block of memory within flash memory 124 is to be erased, the erase block operation is extremely time consuming. For example, in one embodiment, to write a single word to flash memory 124 takes approximately four to six microseconds. On the other hand, in the same embodiment, to erase a single block of flash memory 124 takes approximately 600 milliseconds. In the prior art, during the time that a program word or erase command was being performed, flash memory 124 could not be accessed. In the present invention, flash memory 124 has a command queue for retaining pending program word and erase block commands. The command queue frees up memory bus 120 because, once a command has been queued, memory bus 120 can be used for other purposes. Furthermore, the command queue of the present invention permits most program word commands to jump ahead of erase commands. Both of these features permit central processing unit 110 to continue execution while program word and erase block commands within flash memory 124 are pending.

Figure 2:
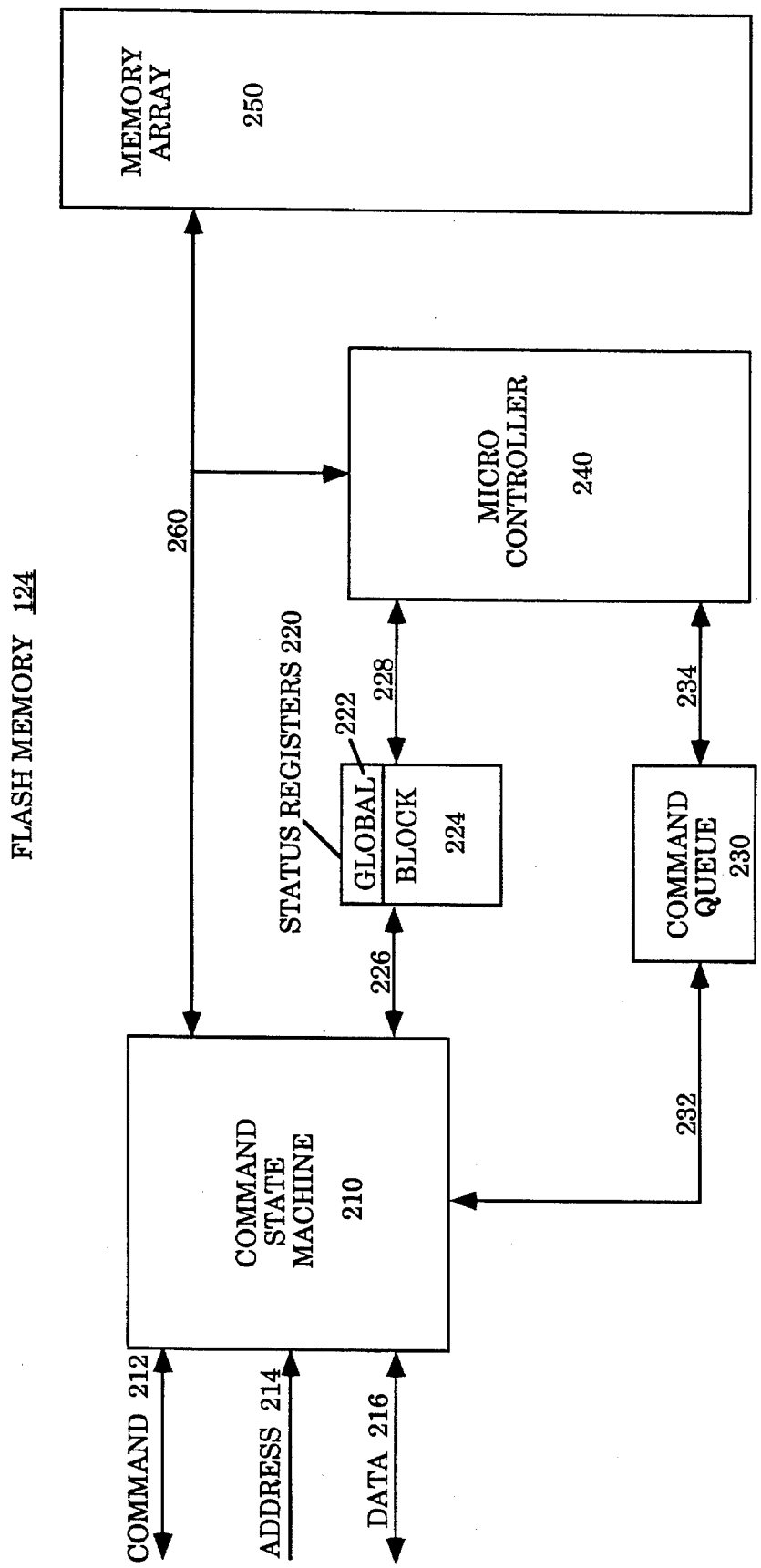
FIG. 2 is a block diagram of a nonvolatile memory device that has a program word and erase block command queue.

Referring now to FIG. 2, a block diagram of flash memory 124 is illustrated. Commands, memory addresses and data enter command state machine 210 of flash memory 124 through command bus 212, address bus 214 and data bus 216, respectively. There are two types of commands that enter command state machine 210 over command bus 212. First, there are commands that can be handled by command state machine 210. Examples of these commands are commands such as a command to examine the value of status registers 220 or a command to read a word of data from memory array 250.

Secondly, commands that are executed by micro controller 240 enter command state machine 210. These commands are the program word and erase block commands. Upon receiving a program word or erase block command, command state machine 210 will determine whether there is a command slot in command queue 230 available and into which the received command can be placed to enter the command into queue 230. If there is no room in the queue 230, command state machine 210 will refuse to accept the command and, as in the prior art where there is no command queue, the device sending the refused command will have to try again later.

If there is room in command queue 230, command state machine 210 will dispatch the command to command queue 230 over bus 232. There, the command will wait until micro controller 240 can execute it. At that time, micro controller 240 will read the command from the command queue and, depending upon the command specified, perform either a program word or erase block operation upon memory array 250.

Status registers 220 is divided into two types of status registers: global status registers 222 and block status registers 224. Global status registers contain information regarding the state of flash memory 124 as a whole. One of the bits of global status registers 222 is a bit that indicates that command queue 230 is full. Command state machine 210 can examine this bit and, if a program word or erase block command is to be added to command queue 230 when command queue 230 is full, command state machine 210 will send a signal over command bus 212 to indicate to the CPU that the flash memory 124 is busy and cannot accept that command at this time.

Memory array 250 is divided into blocks of memory. In one embodiment, there are 32 blocks of memory in memory array 250 with each block containing 64K bytes (1K is equal to 1024). It is the nature of flash memory that individual words within the memory cannot be erased. Instead, an entire block must be erased at a time. Therefore, to specify an erase block operation, the erase block command will identify the block of memory array 250 to be erased.

When an erase block command enters command state machine 210 and command queue 230 is empty, the erase block command will flow through command queue 230 to micro controller 240. There, the erase block command will cause an erase routine to begin executing in micro controller 240. The erase routine is designed to have interrupt windows within it. Each time the erase routine enters an interrupt window, it checks to see whether command queue 230 has had another command added to it. If no command has been added to queue 230 since the last interrupt window, then the erase routine continues execution. If no more commands enter command queue 230 during execution of the erase routine, then when the erase routine completes, the erase block command is purged from command queue 230.

Block status registers 224 is divided into one register for each block of memory array 250. Each block status register has a ready bit that indicates whether the block of memory array 250 corresponding to that block status register is ready to be accessed, or is busy because it has a pending erase block command and therefore cannot be accessed. If a block within memory array 250 is ready to be accessed, then it can be read from or a word within the block can be programmed.

When an erase command is received in command queue 230, the ready bit for the block to be erased is set to indicate that the block is busy. Then, after the block has been erased, the ready bit is set back to indicate that the block is now ready to be accessed again. During the time that a block is busy, information cannot be read from or written to the block. That is because any information written to the block before its block erase has completed will be lost during the block erase. Furthermore, any information read from the block before the block erase has completed will be false information since it was to have been destroyed during the block erase and the block erase command was issued before the read command.

The block busy bits of block status registers 224 are used as a sub-queue for block erase commands. Thus, once a single erase block command has entered command queue 230, it is retained in command queue 230 until any pending block erase commands have been completed. If a second erase block command enters command queue 230 when micro controller 240 is performing a block erase caused by a first erase block command, micro controller 240 will halt at the next window within the erase routine. Then, micro controller 240 will absorb the second erase block command by marking the ready bit of the block specified to be erased in the second command as being busy, and then purging the second erase block command from command queue 230. The erase routine will then continue execution and continue erasing the block specified by the first erase command. Once this block has been erased, the erase routine will mark the ready bit of the block corresponding to the block specified to be erased in the first command as being ready. Then, the erase routine will examine the ready bit of the block status registers of the other blocks. Because the ready bit for the block specified in the second erase block command was marked busy when the second erase block command was absorbed, the erase routine will then erase the block corresponding to the block status register of the block of the absorbed command. The erase routine will continue erasing blocks until the ready bit of each block status register indicates that the block corresponding to the block status register is ready. This will happen when there are no more block erasures pending. Once this happens, the erase routine will stop and the erase block command retained in command queue 230 will be purged from command queue 230.

Note that in the previous example, the second erase block command was absorbed and purged from command queue 230 but that the first erase block command remained in command queue 230 until the entire erase routine completed. Therefore, after the erase routine has caused the erasure of the block specified by the first erase block command, the first erase block command (being retained in command queue 230 until completion of any pending block erasures) is no longer valid but, in effect, becomes a place holder to indicate that an erase block operation is being performed on the block specified by an absorbed erase block command.

If a program word command enters command state machine 210 and command queue 230 is empty, then the program word command will flow through command queue 230 to micro controller 240. Micro controller 240 will then execute a program word routine that will cause the appropriate word of memory array 250 to be programmed with the value specified by the program word command. It takes significantly less time for a word to be programmed than for a block to be erased. Furthermore, a program word command is an extremely time critical command. Therefore, there are no interrupt windows within the program word routine. Thus, once the program word routine begins, it will continue to completion regardless of any subsequent instructions that enter command queue 230.

A program word command can enter command queue 230 while micro controller 240 is executing the erase routine. At the next window encountered during the erase routine, micro controller 240 will examine the program word command to determine the block containing the word which is to be programmed. If there is no pending erase block operation to be performed on the block containing the word to be programmed, then micro controller 240 will perform a context switch and execute the program routine to program the word to be programmed. Once the word has been programmed, the program word command will be purged from command queue 230, the context will switch back to the erase routine and micro controller 240 will return back to executing the suspended erase routine.

If, on the other hand, the word to be programmed is contained in a block that is slated to be erased, then micro controller 240 will not service the program word command until the pending erase block command for the block containing the word to be programmed has completed. Because erasure of the block containing the word to be programmed is holding up a higher priority program word command, the erase routine will erase the block containing the word to be programmed ahead of any other block having pending erasures. Furthermore, during the erasure of the block containing the word to be programmed, the erase routine will not halt during interrupt windows to check for the addition of any new commands into command queue 230. Once this high priority block has been erased, micro controller 240 will mark the ready bit of the priority block to indicate that the priority block is ready, switch context, execute the program word routine to program the word of the pending program word command and then return to erase any other blocks having pending erase block commands.

Further details regarding an embodiment of a method and circuitry for storing and prioritizing erase block commands in a memory device can be found in co-pending U.S. patent application Ser. No. 08/143,293, filed on Oct. 26, 1993.

Figure 3:
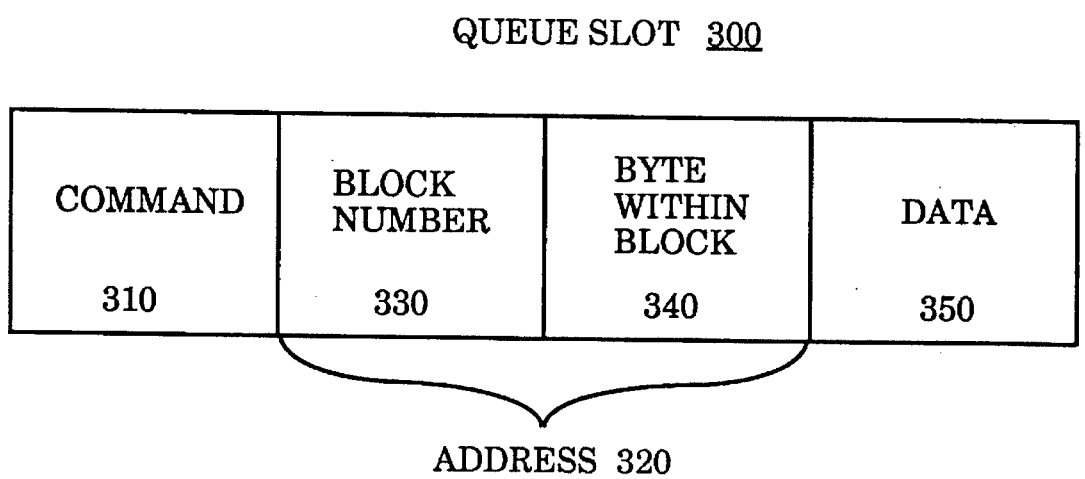
FIG. 3 illustrates the data structure of a command slot of the program word and erase block command queue.

Referring now to FIG. 3, a single queue slot within the command queue is illustrated. Each queue slot 300 of FIG. 3 is able to store one pending erase block command or is able to store one pending program word command. Each queue slot 300 contains all of the information necessary for the micro controller to execute the routine associated with the command stored within the queue slot.

Queue slot 300 is divided into four fields. The first field is command field 310. Command field 310 stores an indicator of the operation that is being stored in the queue slot (e.g. a program word command or an erase block command). In one embodiment, the indicator stored in command field 310 is a memory address of a memory location containing the first word of the routine to be executed by the micro controller to carry out the command.

The block number field 330 and byte within block field 340 together combine to form address field 320. In an embodiment where there are 32 possible blocks, the block number field 330 can be represented by the five most significant bits of address field 320. In the case where a word within a block is to be programmed, then the contents stored in the block number field 340 of address field 320 specifies the block containing the word to be programmed and then contents stored in the byte within block field 340 of address field 320 specifies the byte to be programmed within the specified block. In the example where each block contains 64 kilobytes of information, byte within block field 340 would be the 16 least significant bits of address field 320.

The erase block command causes the erasure of every word within the block specified by the command. Thus, in the case where an erase block command is to be executed, the erase block command specifies the block to be erased, but does not specify a particular word within the block. Therefore, for an erase block command, the block number field 330 is filled but the byte within block field 340 is not filled.

Contents for data field 350 also is not specified for an erase block command. On the other hand, if a word is to be programmed, then data field 350 contains the word of data to be programmed.

Figure 4:
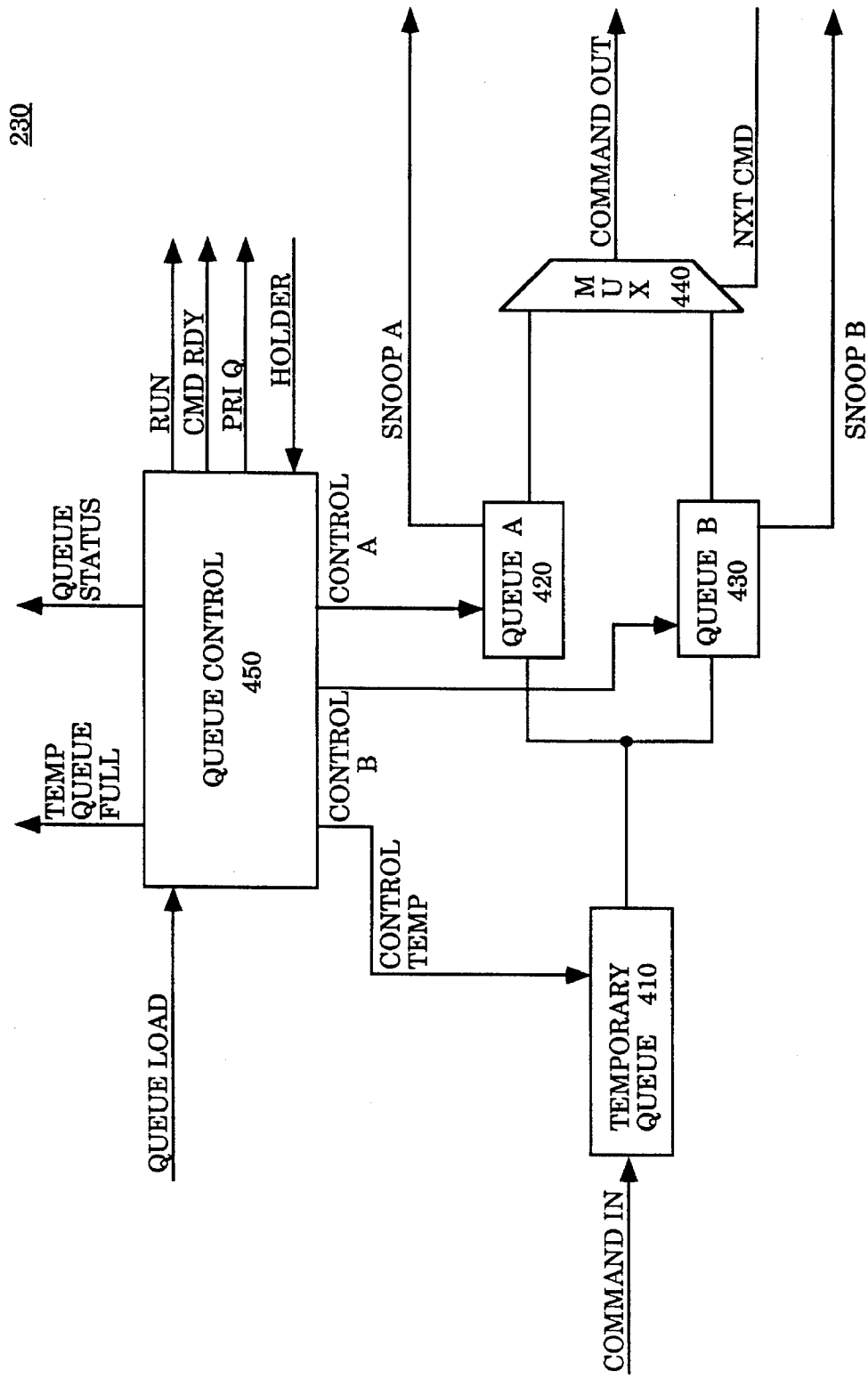
FIG. 4 is a block diagram of the program word and erase block command queue of the nonvolatile memory.

Referring now to FIG. 4, a block diagram of a command queue is illustrated. Command queue 230 of FIG. 4 is illustrated as having three queue slots. The first queue slot is temporary queue 410 and is a temporary queue slot into which every program word or erase block command is initially latched. Because there is no direct data path from temporary queue 410 to the micro controller, commands latched into temporary queue 410 cannot be executed directly from temporary queue 410. Instead, each command is held until queue slot queue A 420 or queue slot queue B 430 is empty.

Queue slot queue A 420 and queue slot queue B 430 are both active queues slots and therefore have data paths to the micro controller. These data paths are controlled by multiplexer 440. Based on the value of signal NXT CMD that is asserted by the micro controller, multiplexer 440 will provide a data path from queue A 420 or queue B 430 to the micro controller over signal line COMMAND OUT.

Signal lines SNOOP A and SNOOP B are used by the micro controller to snoop the values stored in queue A 420 and queue B 430 during an interrupt caused by the entry of a command into an active queue slot. Snooping permits the micro controller to determine how the interrupt is to be handled. This permits the micro controller to prioritize new commands entering active slots of the command queue without actually changing the data path through multiplexer 440.

Queue control block 450 is a state machine that controls the operation of the command queue. Signal line CONTROL TEMP is used to control the latching of commands into temporary queue 410 and to control the subsequent release of commands from temporary queue 410. Similarly, signal line CONTROL A is used cause data to be latched into queue A 420 and is also used to cause a command stored within the queue A 420 slot to be purged. Finally, signal line CONTROL B is used to cause data to be latched into queue B 430 and is also used to cause a command stored within the queue B 430 slot to be purged.

Whenever the command state machine receives a command that is to be processed by the micro controller, the command state machine notifies queue control 450 of the pending command by signal line QUEUE LOAD. If the command queue 230 is empty when a command is to be entered into queue 230, queue control 450 will assert signal RUN. The assertion of signal RUN informs the micro controller that it is to begin operating. Therefore, the micro controller will be prepared to execute the routine associated with the command that is entering command queue 230 as soon as the command enters an active command slot. Signal line QUEUE STATUS is used to inform the micro controller, and other circuitry, as to how many of the queue slots 410, 420 and 430 contain commands.

Command signal TEMP QUEUE FULL is used by queue control 450 to set the queue full bit in the global block status register when each of the queue slots has been filled. This queue full bit can then be read by the command state machine to determine whether or not a command subsequently received by the command state machine can enter command queue 230.

The signal COMMAND READY acts as an interrupt to inform the micro controller that at least two commands are currently residing in the queue. When the micro controller is executing the erase routine and reaches an interrupt window, it will test the value of signal COMMAND READY. If signal COMMAND READY is asserted, then the micro controller will suspend the execution of the erase routine and determine how to handle the pending command in the other active queue. A routine named INTERRUPT START will determine whether the pending command is to be executed or absorbed before the erase routine processing continues or whether execution of the pending command is to be deferred. In one embodiment, the INTERRUPT START routine is a software routine executed by the micro controller. In an alternate embodiment, the INTERRUPT START routine is implemented in hardware but called by the micro controller as though it is a software routine.

As mentioned previously, occasionally an erase block command will be absorbed and then purged from the command queue. If the erase block command currently residing in the queue has been completed but not purged, the signal HOLDER will indicate to queue control 450 that the erase block command stored in command queue 230 identifies a block that has already been erased. This is the case where the erase block command in the queue is simply a place holder command that is being used to signify that additional previously absorbed block erasures are pending.

At any given time, either queue slot A 420 or queue slot B 430 will be the primary queue slot. The other queue slot will then be the secondary queue slot. The primary queue slot contains the older (i.e. earlier received) command in command queue 230 and the secondary queue slot contains the younger (i.e. later received) command in command queue 230. When the older command (in the primary queue slot) completes and there is a younger command (in the secondary queue slot), rather than transfer the younger command from the secondary queue slot to the primary queue slot, the primary and secondary slot designation simply toggles. Thus, the queue slot that was the secondary queue slot switches and becomes the primary queue slot and the queue slot that was the primary queue slot switches and becomes the secondary queue slot. Therefore, signal PRI Q from queue control 450 is used to notify micro controller 240 whether queue slot queue A 420 or queue B 430 is the queue slot that is currently assigned to be the primary queue slot. In one embodiment, multiplexer 440 is set up so that its default output is the input pertaining to the queue slot that is most frequently the primary queue. Thus, multiplexer 440 defaults so that its output is the primary queue at most times.

Although the embodiment depicted in FIG. 4 shows only two active queue slots in command queue 230, in general, command queue 230 can be expanded to have any number of active queue slots. Thus, for example, in a case where there are three active slots, there will be command queue slots A, B and C. At any given time, each slot will correspond to a primary, secondary and tertiary command slot.

Figure 5:
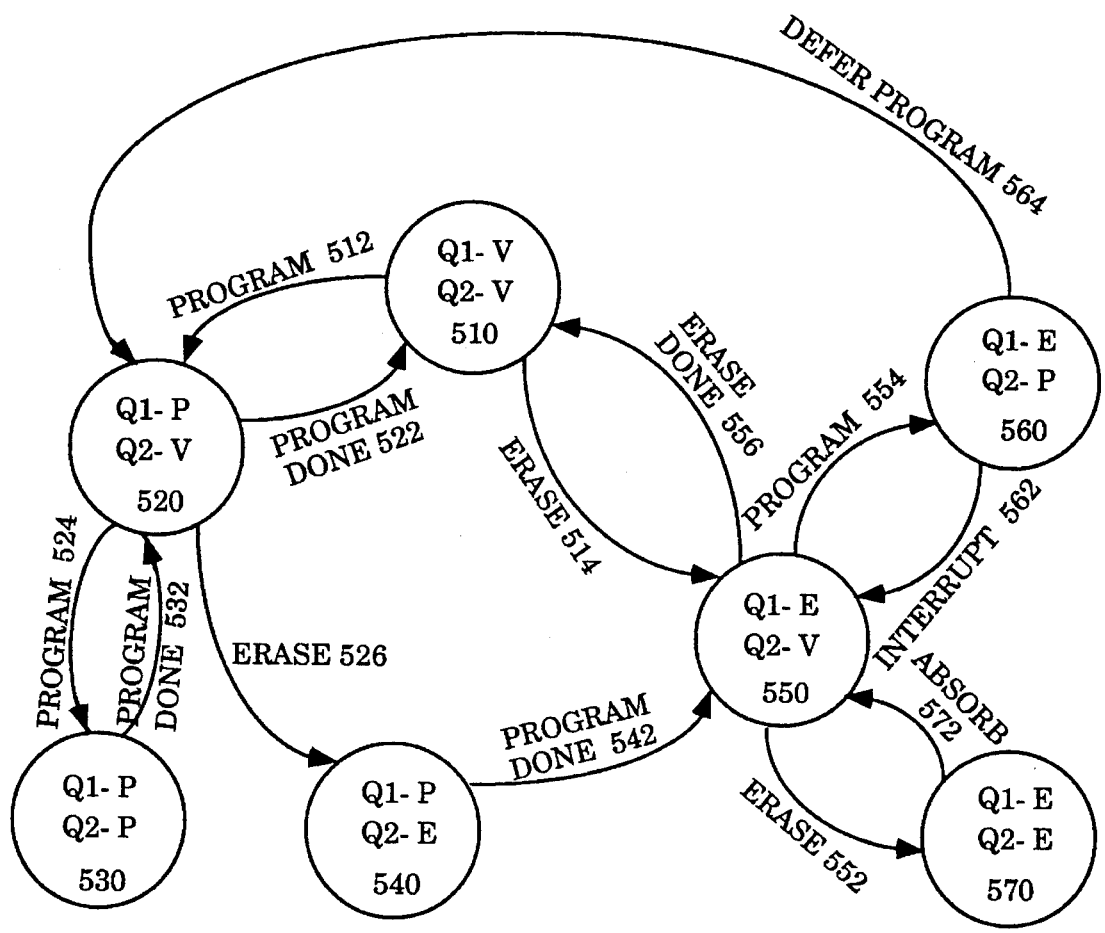
FIG. 5 is a state transition diagram of the program word and erase block command queue.

Referring now to FIG. 5, a state transition diagram is depicted for the command queue of FIG. 4. In FIG. 5, the initial state of the command queue is state 510. In state 510, the primary queue slot and the secondary queue slot are both vacant (indicated in FIG. 5 by the labels Q1-V and Q2-V, respectively).

There are basically four events that can cause a state transition in FIG. 5. These four events are: the arrival of a program word command into an active queue slot, the arrival of an erase block command into an active queue slot, the completion of the programming of a word and the completion of the erasure of a block. In initial state 510, because both the primary and secondary queues are vacant (empty), there is no pending program word command and there is no pending erase block command to complete. Therefore, a state transition from initial state 510 will only occur upon the receipt of a program word command into an active queue slot or upon the receipt of an erase block command into an active queue slot.

When the command queue is in initial state 510 and a program word command is received into an active queue slot, path PROGRAM 512 will be taken to state 520. In state 520, the program word command will enter the active primary queue slot (indicated in FIG. 5 by the label Q1-P) and execution of the program routine by the micro controller will begin. Once the program routine begins, the micro controller will not interrupt execution until the word specified by the program word command has been programmed. If no additional command is received in the command queue before the word to be programmed has been programmed, then upon completion of the program routine, the program word command will be purged from the primary queue slot and path PROGRAM DONE 522 will be taken back to the initial state 510 where both the primary and secondary queue slots are empty.

In state 520, it is possible for either a program word command or an erase block command to enter the secondary queue slot (indicated in FIG. 5 by the labels Q2-P and Q2-E, respectively) while the program word command in the primary queue slot is being serviced by the micro controller. Note that whenever a command enters the secondary queue slot the signal COMMAND READY is asserted to inform the micro controller that an interrupt is pending. Because no interruption is permitted during the program routine, however, the command in the secondary queue slot must wait for completion of the program word command in the primary queue before it will be serviced by the micro controller.

In the case of the receipt of a second program word command, the second program word command is stored in the secondary queue slot pending completion of the first program word command in the primary queue slot and transition PROGRAM 524 will be taken to state 530. When the first program word command in the primary queue slot completes, the completed first program word command will be purged from the primary queue slot, the pending second program word command will enter the primary queue slot and the secondary queue will become empty. Thus, transition PROGRAM DONE 532 will be taken back to state 520 upon completion of the first program word command. Note that this process can occur simply by toggling the primary queue pointer from the active queue slot containing the first program word command to the active queue slot containing the second program word command and then purging the first program word command from the queue slot containing it.

Referring again to state 520, in state 520 the primary queue slot contains a program word command and the secondary queue is empty. If an erase block command is received in state 520, the erase block command will be stored in the secondary queue slot pending completion of the program word command in the primary queue slot and therefore path ERASE 526 will be taken to state 540. Because the program word command is not interruptable, the erase block command will remain in the secondary queue slot until the program word command completes. When the program word command completes, path PROGRAM DONE 542 will be taken from state 540 to 550.

In state 550, the program word command will be purged from the primary queue slot, the erase block command will enter the primary queue slot (indicated in FIG. 5 by the label Q1-E) and the secondary queue slot will become vacant. When the erase block command enters the primary queue slot, the erase routine will begin execution within the micro controller.

If no other commands are received in the command queue before the block of the erase block command in the primary queue slot is erased, transition ERASE DONE 556 will occur upon completion of the erasure of the block. If transition ERASE DONE 556 occurs, then the erase command will be purged from the primary queue slot and, because there are no other pending commands, initial state 510 will be entered. In state 510 both the primary and secondary queue slots are empty.

Referring again to state 550, in state 550 the primary queue slot contains an erase block command and the secondary queue slot is empty. If a second erase block command is received in state 550, then the second erase block command will enter the secondary queue slot and path ERASE 552 will be taken to state 570.

Note that whenever a command enters the secondary queue slot the signal COMMAND READY is asserted to inform the micro controller that an interrupt is pending. Although the signal COMMAND READY is asserted as soon as the second command enters the secondary queue slot, execution of the erase program will continue with the erase program erasing the block specified by the first erase block command until the erase routine reaches an interrupt window. When the erase routine reaches an interrupt window, the second erase block command will be absorbed and then purged from the secondary queue slot and path ABSORB 572 will be taken to state 550. Later, in state 550, when the block specified by the erase command in the primary queue has been erased, the block specified by the erase block command that has been absorbed will be erased. If no subsequent program word commands are received while in state 550, upon completion of all absorbed erase block commands, the place holder erase block command will be purged from the primary queue slot and path ERASE DONE 556 will be taken back to initial state 510 where both the primary and secondary queue slots are empty.

Referring again to state 550, in state 550 the primary queue slot contains an erase block command and the secondary queue slot is vacant. If a program word command is received in state 550, then the program word will enter the secondary queue slot and transition PROGRAM 554 will be taken to state 560. In state 560, the primary queue will contain an erase block command that is being serviced and the secondary queue will contain the pending program word command. When the erase routine reaches its next interrupt window, the program word command in the secondary queue will be examined by routine INTERRUPT START to determine how the pending program word command will be handled.

If there is no block erase pending for the block containing the word specified to be programmed by the program word command, service of the erase command in the primary queue will be suspended. Then, a context switch will occur from the erase routine to the program routine and the word specified by the program word command in the secondary queue will be programmed. Next, the secondary queue will be purged of the completed program word command causing a return along path INTERRUPT 562 to state 550. In state 550, a context switch will be made back to the erase routine that was suspended and the erase routine will continue execution to complete any pending block erasures.

Referring again to state 560, in state 560 the primary queue slot contains an erase block command and the secondary queue contains a pending program word command. If it is determined by the INTERRUPT START routine that the word specified by the program word command is contained in a block that has a block erase pending, then service of the program word command in the secondary queue slot will be deferred (skipped) until after the block containing the word to be programmed has been erased. In one embodiment, once all blocks awaiting erasure have been erased, then the erase command will be purged from the primary queue slot and the program word command in the secondary queue slot will enter the primary queue slot. In this case, transition DEFER PROGRAM 564 will be taken to state 520.

In an alternate embodiment, if more than one block erasure is pending in state 560, the block to be erased containing the word to be programmed will receive priority and be erased before any other blocks with pending erasures are erased. Then, upon completion of erasure of this priority block, a context switch will occur to the program routine and the word within the block to be programmed will be programmed. Upon completion of programming of the word, the program word command will be purged from the secondary queue slot and state 550 will be entered. In state 550, the suspended erase routine will commence and the remaining blocks having pending erases will then be erased.

Note that during this priority block erasure, there is no need for the erase routine to stop at each interrupt window and determine how to handle the command in the secondary queue slot. This is because the program word command in the secondary queue slot will not be able to be serviced until the priority block has been erased. Therefore, in this situation, a global interrupt ignore flag is set within the erase routine to indicate that any interrupts signaled by the COMMAND READY signal during the priority block erasure are to be ignored. Then, once the priority block erasure has completed, the global interrupt flag will be reset so that the interrupt request caused by the program word command in the secondary queue will be serviced.

Finally, referring again to initial state 510, if an erase block command is received when both the primary and secondary queue slots are empty, then the erase block command will enter the primary queue slot and state 550 will be entered as indicated by path ERASE 514. In state 550, the erase block command in the primary queue will be serviced by the micro controller. Subsequent transitions from state 550 will occur as has been previously discussed.

Figure 6:
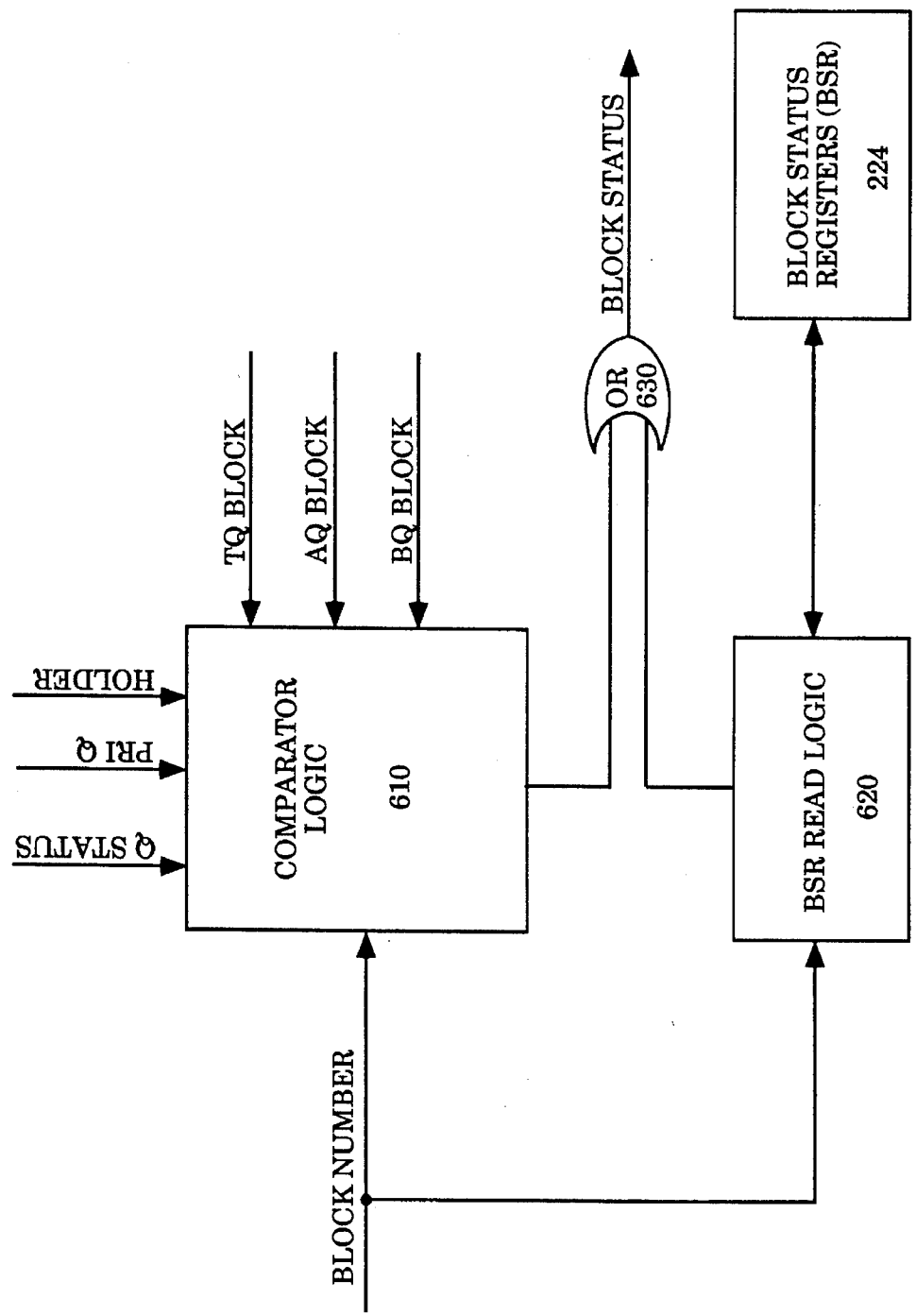
FIG. 6 is a diagram that illustrates circuitry for determining the status of a memory block of the nonvolatile memory device.

Referring now to FIG. 6, a diagram is presented that illustrates circuitry for determining the status of a particular memory block of the nonvolatile memory device. One command that can be serviced by the command state machine is a block status query command. The block status query command is a request regarding the ready status of a block of the memory array. A query block is specified when the block status query command is issued. The query block is the particular block of the memory array that is to have its ready status determined. If no erase block or program word commands for the query block are pending, then the block status returned by the block query command for the query block will be that of ready. If, on the other hand, at least one program word or erase block command is pending for the query block, then the status returned will be busy.

If there was no command queue, then the status of the query block could be determined simply by examining the ready bit of the block status register corresponding to the query block. Because there is a command queue, however, it is possible for the ready bit in a block status register corresponding to the query block to improperly reflect the status of the block. This is because commands waiting in the command queue may not have been serviced and therefore are not reflected in the block status register.

Furthermore, in comparison to an erase block command, a program word command is executed in a relatively short amount of time, and is an extremely time critical operation. Therefore, to save time when programming a word, the ready bit of the block containing the word to be programmed is not set at the beginning of the program word routine and then reset at the end of the program word routine. Thus, when a program word command is being serviced, the block containing the word being programmed will be busy but the ready bit in the block status register for this block will indicate that the block is ready.

When the status of a block is to be determined, the block number of the query block is sent from the command state machine to block status register (BSR) read logic 620. Upon receiving the block number of the query block, BSR read logic 620 extracts the value stored in the ready bit of the specified block from block status registers 224 and provides this information to OR gate 630.

Furthermore, when the status of a block is to be determined, the block number of the query block is also sent from the command state machine to comparator logic 610. It is the function of comparator block 610 to determine whether any pending commands in the command queue are commands that affect the ready status of the query block. If comparator block 610 determines that at least one pending command in the command queue is a command that affects the ready status of the query block, then comparator logic 610 will indicate a match to OR gate 630. If comparator block 610 determines that there are no pending commands or that no pending commands in the command queue are commands that affect the ready status of the query block, then comparator logic 610 will indicate no match to OR gate 630.

OR gate 630 performs an OR operation on the output from comparator logic 610 and the output from BSR read logic 620 and the result of the OR operation is the block status indicator returned by the block status query command.

The command queue only contains program word and erase block commands and, once the commands have been absorbed or performed, they are purged from the command queue. Furthermore, both program word and erase block commands affect the ready status of the block upon which they act. An identifier of the block that will be affected by the command is stored in the command queue along with the command. Therefore, except for one well defined exceptional case, if comparator logic 610 detects at least one command in the command queue that identifies the block that it will affect as being the query block, then comparator logic 610 will indicate a match to OR gate 610 to signify that the status of the query block is busy. Otherwise, comparator logic 610 will indicate no match to OR gate 610 to signify that, with respect to the pending commands in the command queue (if any), the status of the query block is ready.

The one well defined exceptional case is the case that occurs when the block specified to be erased by an erase command in the primary slot has been erased and the erase block command retained in the primary command slot is acting as a place holder for pending absorbed erase block commands. In this case, if the query block is the same block as the block of the place holder command in the primary queue, comparator logic 610 should indicate no match to OR gate 610 and thereby signify that, with respect to the pending commands in the command queue, the status of the query block is ready (even though the block specified by the place holder erase block command in the primary queue slot will match the block number of the query block).

Note that if a second erase block command that specifies the query block as being the block to be erased is in the command queue and has not yet been absorbed, then comparator logic 610 should indicate a match to OR gate 610 and thereby signify that, even though the first erase block command (serving as a place holder in the primary queue) identifies the query block as its block to be erased, with respect to the pending commands in the command queue, the status of the query block is busy.

The signals PRI Q, Q STATUS, TQ BLOCK, AQ BLOCK, BQ BLOCK and HOLDER are input to comparator logic 610 and provide the information necessary for comparator 610 to determine whether or not any pending commands in the command queue are commands that affect the ready status of the query block.

Signal Q STATUS indicates to comparator logic 610 which, if any, of the queue slots (i.e. the temporary queue slot and the queue A and B queue slots) currently contain pending commands. Signal PRI Q indicates to comparator logic 610 whether it is queue A or queue B that is currently the primary queue.

If a pending command is stored in the temporary queue slot, signal TQ BLOCK will provide to comparator logic 610 the block number of the command stored in the temporary queue slot. Similarly, if a pending command is stored in the queue A slot, signal AQ BLOCK will provide to comparator logic 610 the block number for the command stored in the queue A slot. Furthermore, if a pending command is stored in the queue B slot, signal BQ BLOCK will provide to comparator logic 610 the block number for the command stored in the queue B slot.

Signal HOLDER indicates to comparator logic 610 the existence of the condition that occurs when the block specified to be erased by an erase command in the primary slot has been erased but the erase command in the primary slot is acting as a place holder for pending absorbed erase block commands. If signal HOLDER is not asserted (i.e. the command in the primary queue, if any, is not acting as a place holder), then comparator logic 610 will compare the block numbers of any commands currently residing in command slots of the queue to the query block number specified by the examine block status command. If the query block number matches the block number of any commands within the command queue, then comparator logic 610 will indicate a match to OR gate 630.

As mentioned previously, OR gate 630 performs an OR operation on the output from comparator logic 610 and BSR read logic 620 and the result is a block status indicator for the query block. Thus, if the block specified to have its status determined does not match the block of a pending command in the command queue and the block status register ready bit for the query block indicates that the block is ready, signal BLOCK STATUS will indicate the block status of the query block to be that of ready. If, on the other hand, the block number of the query block matches the block number of a command waiting in a command queue, or if the ready bit for the block status register of the block indicates the block to be busy, then signal BLOCK STATUS will indicate that the query block is busy.

Referring again to signal HOLDER, if the erase command in the primary queue is acting as a place holder for one or more absorbed commands, then comparator logic 610 will not compare the block number of the query block to the block number of the erase block command stored in the primary queue slot. Therefore, even if a match is made between the block number of the query block and the block number of the erase block command serving as a place holder in the primary queue, comparator logic 610 will not output a block busy status to OR gate 630 unless at least one other command in the command queue indicates that it will affect the query block.

Thus, a method and apparatus has been described for queuing erase block and program word commands within a nonvolatile memory device. A method and circuitry has also been described for determining the ready status of a block of memory within the nonvolatile memory device having the erase block and program word command queue.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. Command queuing circuitry comprising:
 a primary queue for holding a first command, the first command being an erase block command specifying a first flash memory block to be erased;
 a secondary queue for holding a second command, received subsequent to the first command, the second command being either a second erase block command specifying a second flash memory block to be erased or a first program word command specifying a first flash memory word to be programmed;
 snooping circuitry for examining the second command, without servicing the second command, prior to completion of service of the first command:

prioritization circuitry for determining the priority of the snooped second command, if the second command is the first program word command and the first flash memory word is not part of the first flash memory block, the second command having a higher priority than the first command;

switching circuitry for suspending service of the first command and permitting service of the second command if the second command has a higher priority; and command absorption circuitry to incorporate service of the second command into service of the first command and then purge the second command from the secondary queue if the second command is the second erase flash block command.

2. The command queuing circuitry as set forth in claim 1 further comprising:

priority increasing circuitry to increase the priority, with respect to a first pending erase block erasure, of erasure of an erase-pending erase block specified by a second pending erase block erasure, if the second command is the first program word command and the second command is specifying a flash memory word to be programmed that is part of the erase-pending erase block specified by the second pending erase block erasure.

3. The command queuing circuitry as set forth in claim 1 further comprising:

slot toggle circuitry to override the primary and secondary queue designations so that the primary queue becomes the secondary queue and the secondary queue becomes the primary queue in the event that service of the first command completes while a pending second command is being held in the secondary queue.

4. The command queuing circuitry as set forth in claim 1 wherein each pending command affects the status of a corresponding erase block of the flash memory, the command queuing circuitry further comprising:

block status circuitry to determine whether any commands within the queue affect the status of a query block, the query block being a designated one of the erase blocks of the flash memory.

5. The command queuing circuitry as set forth in claim 4 wherein the block status circuitry further comprises:

pending command query circuitry to determine whether any pending commands affect the status of the query block and to provide a pending status signal that indicates the status of the query block with respect to the pending commands;

currently servicing query circuitry to determine whether the command currently being serviced affects the status of the query block and to provide a servicing status signal that indicates the status of the query block with respect to the servicing command; and, integration circuitry to combine the pending status signal and the currently servicing status signal to form a query block status signal that indicates the status of the query block with respect to all commands within the command queue.

6. The command queuing circuitry as set forth in claim 1 further comprising:

a temporary queue to hold at least one command received subsequently to the first and second commands until the secondary queue becomes available.

7. The command queuing circuitry as set forth in claim 1 wherein the primary queue can receive a second program word command if the primary queue is empty.

8. Command queuing circuitry comprising:

a primary queue to hold a first command, the first command being an erase block command specifying a first flash memory block to be erased;

a secondary queue to hold a second command, received subsequent to the first command, the second command being either a second erase block command specifying a second flash memory block to be erased or a first program word command specifying a first flash memory word to be programmed;

a snooper to examine the second command, without servicing the second command, prior to completion of service of the first command;

a prioritizer to determine the priority of the snooped second command, if the second command is the first program word command and the first flash memory word is not part of the first flash memory block, the second command having a higher priority than the first command;

a switch to suspend service of the first command and permit service of the second command if the second command has a higher priority; and a command absorber to incorporate service of the second command into service of the first command and then purge the second command from the secondary queue if the second command is the second erase flash block command.

9. The command queuing circuitry as set forth in claim 8 further comprising:

a priority increaser to increase the priority, with respect to a first pending erase block erasure, of erasure of an erase-pending erase block specified by a second pending erase block erasure, if the second command is the first program word command and the second command is specifying a flash memory word to be programmed that is part of the erase-pending erase block specified by the second pending erase block erasure.

10. The command queuing circuitry as set forth in claim 8 further comprising:

a slot toggler to override the primary and secondary queue designations so that the primary queue becomes the secondary queue and the secondary queue becomes the primary queue in the event that service of the first command completes while a pending second command is being held in the secondary queue.

11. The command queuing circuitry as set forth in claim 8 wherein each pending command affects the status of a corresponding erase block of the flash memory, the command queuing circuitry further comprising:

a block status checker to determine whether any commands within the queue affect the status of a query block, the query block being a designated one of the erase blocks of the flash memory.

12. The command queuing circuitry as set forth in claim 11 wherein the block status circuitry further comprises:

a pending command query checker to determine whether any pending commands affect the status of the query block and to provide a pending status signal that indicates the status of the query block with respect to the pending commands;

a currently servicing query checker to determine whether the command currently being serviced affects the status of the query block and to provide a servicing status signal that indicates the status of the query block with respect to the servicing command; and, a status integrator to combine the pending status signal and the currently servicing status signal to form a query block status signal that indicates the status of the query block with respect to all commands within the command queue.

13. The command queuing circuitry as set forth in claim 8 further comprising:

a temporary queue to hold at least one command received subsequently to the first and second commands until the secondary queue becomes available.

14. The command queuing circuitry as set forth in claim 8 wherein the primary queue can receive a second program word command if the primary queue is empty.

15. A command queuing method, comprising the steps of:

holding a first command in a primary queue, the first command being an erase block command specifying a first flash memory block to be erased;

holding a second command, received subsequent to the first command, in a secondary queue, the second command being either a second erase block command specifying a second flash memory block to be erased or a first program word command specifying a first flash memory word to be programmed;

examining the second command, without servicing the second command, prior to completion of service of the first command;

determining the priority of the snooped second command, if the second command is the first program word command and the first flash memory word is not part of the first flash memory block, the second command having a higher priority than the first command;

suspending service of the first command and permitting service of the second command, if the second command has a higher priority than the first command; and incorporating service of the second command into service of the first command and then purging the second command from the secondary queue, if the second command is the second erase flash block command.

16. The command queuing method as set forth in claim 15 further comprising the step of:

increasing the priority, with respect to a first pending erase block erasure, of erasure of an erase-pending erase block specified by a second pending erase block erasure, if the second command is the first program word command and the second command is specifying a flash memory word to be programmed that is part of the erase-pending erase block specified by the second pending erase block erasure.

17. The command queuing method as set forth in claim 15 further comprising the step of:

overriding the primary and secondary queue designations so that the primary queue becomes the secondary queue and the secondary queue becomes the primary queue in the event that service of the first command completes while a pending second command is being held in the secondary queue.

18. The command queuing method as set forth in claim 15 wherein each pending command affects the status of a corresponding erase block of the flash memory, the command queuing method further comprising the step of:

determining whether any commands within the queue affect the status of a query block, the query block being a designated one of the erase blocks of the flash memory.

19. The command queuing method as set forth in claim 18 wherein the block status query step further comprises the steps of:

determining whether any pending commands affect the status of the query block and to providing a pending status signal that indicates the status of the query block with respect to the pending commands;

determining whether the command currently being serviced affects the status of the query block and providing a servicing status signal that indicates the status of the query block with respect to the servicing command; and, combining the pending status signal and the currently servicing status signal to form a query block status signal that indicates the status of the query block with respect to all commands within the command queue.

20. The command queuing method as set forth in claim 15 further comprising the step of:

holding at least one command received subsequently to the first and second commands until the secondary queue becomes available.

21. The command queuing method as set forth in claim 15 further comprising the step of:

receiving a second program word command in the primary queue if the primary queue is empty.

22. A system comprising:

a command issuing device for issuing flash memory program and erase commands;

a command servicing device for servicing the program and erase commands issued by the command issuing device; and command queuing circuitry, including:

a primary queue for holding a first command, the first command being an erase block command specifying a first flash memory block to be erased;

a secondary queue for holding a second command, received subsequent to the first command, the second command being either a second erase block command specifying a second flash memory block to be erased or a first program word command specifying a first flash memory word to be programmed;

snooping circuitry for examining the second command, without servicing the second command, prior to completion of service of the first command;

prioritization circuitry for determining the priority of the snooped second command, if the second command is the first program word command and the first flash memory word is not part of the first flash memory block, the second command having a higher priority than the first command;

switching circuitry for suspending service of the first command and permitting service of the second command if the second command has a higher priority; and command absorption circuitry to incorporate service of the second command into service of the first command and then purge the second command from the secondary queue if the second command is the second erase flash block command.

23. The system as set forth in claim 22 further comprising:

priority increasing circuitry to increase the priority, with respect to a first pending erase block erasure, of erasure of an erase-pending erase block specified by a second pending erase block erasure, if the second command is the first program word command and the second command is specifying a flash memory word to be programmed that is part of the erase-pending erase block specified by the second pending erase block erasure.

24. The system as set forth in claim 22 further comprising:

slot toggle circuitry to override the primary and secondary queue designations so that the primary queue becomes the secondary queue and the secondary queue becomes the primary queue in the event that service of the first command completes while a pending second command is being held in the secondary queue.

25. The system as set forth in claim 22 wherein each pending command affects the status of a corresponding erase block of the flash memory, the command queuing circuitry further comprising:

block status circuitry to determine whether any commands within the queue affect the status of a query block, the query block being a designated one of the erase blocks of the flash memory.

26. The system as set forth in claim 25 wherein the block status circuitry further comprises:

pending command query circuitry to determine whether any pending commands affect the status of the query block and to provide a pending status signal that indicates the status of the query block with respect to the pending commands;

currently servicing query circuitry to determine whether the command currently being serviced affects the status of the query block and to provide a servicing status signal that indicates the status of the query block with respect to the servicing command; and, integration circuitry to combine the pending status signal and the currently servicing status signal to form a query block status signal that indicates the status of the query block with respect to all commands within the command queue.

27. The system as set forth in claim 22 further comprising:

a temporary queue to hold at least one command received subsequently to the first and second commands until the secondary queue becomes available.

28. The system as set forth in claim 22 wherein the primary queue can receive a second program word command if the primary queue is empty.

* * * * *